(12) United States Patent
Adams et al.

(10) Patent No.: US 6,512,419 B1
(45) Date of Patent: Jan. 28, 2003

(54) METHOD AND APPARATUS TO TUNE AND CALIBRATE AN ON-CHIP OSCILLATOR IN A WIRELESS TRANSCEIVER CHIP

(75) Inventors: Andrew Adams, Stanmore (AU); Neil Weste, Castle Hill (AU); Stephen Avery, Kellyville (AU)

(73) Assignee: Cisco Sytems Wireless Networking (Australia) Pty Limited, North Sydney (AU)

( * ) Notice: Subject to any disclaimer, the term of this patent is extended or adjusted under 35 U.S.C. 154(b) by 0 days.

(21) Appl. No.: 09/952,925

(22) Filed: Sep. 14, 2001

Related U.S. Application Data
(60) Provisional application No. 60/277,370, filed on Mar. 19, 2001, and provisional application No. 60/283,609, filed on Apr. 13, 2001.

(51) Int. Cl.[7] .......................... H03L 7/08; H03L 7/085; H03L 7/099; H03L 7/18
(52) U.S. Cl. ................. 331/17; 331/8; 331/44; 331/179; 327/156; 327/157
(58) Field of Search ................. 331/1 A, 8, 10, 331/12, 17, 18, 25, 44, 179; 327/11, 156–159; 360/51; 375/376; 455/260

(56) References Cited

U.S. PATENT DOCUMENTS

| | | | |
|---|---|---|---|
| 4,409,563 A | 10/1983 | Vandegraaf | 331/11 |
| 5,259,007 A | 11/1993 | Yamamoto | 375/120 |
| 5,686,867 A | * 11/1997 | Sutardja et al. | 331/177 R |

* cited by examiner

Primary Examiner—David C. Mis
(74) Attorney, Agent, or Firm—Dov Rosenfeld; Inventek

(57) ABSTRACT

A local oscillator calibrator comprises a main charge pump that drives a voltage controlled oscillator (VCO) through a loop filter. A second, replica charge pump can also drive the VCO, but is setup to output only its most positive or most negative analog output control voltage. Since the construction and characteristics of the replica charge pump duplicate the main charge pump, the main charge pump's minimum and maximum analog control outputs can be cloned out to the VCO on demand. A VCO calibration procedure therefore includes switching the VCO to each of its ranges set by a bank of fixed capacitors, and using the replica charge pump to drive the VCO to its minimum and maximum frequency for each range setting. The min-max frequency data is stored in a lookup table, and operational requests to switch to a new channel frequency can be supported with a priori information about which fixed-capacitor range selection will be best.

19 Claims, 3 Drawing Sheets

METHOD AND APPARATUS TO TUNE AND CALIBRATE AN ON-CHIP OSCILLATOR IN A WIRELESS TRANSCEIVER CHIP

RELATED PATENT APPLICATIONS

This Application claims benefit of two U.S. Provisional Patent Applications. The first is Ser. No. 60/277,370, filed Mar. 19, 2001, and titled SYSTEM USING SINGLE CHIP WIRELESS LAN MODEM AND SINGLE CHIP RADIO TRANSCEIVER AND APPARATI, METHODS, AND SOFTWARE PRODUCTS USED THEREIN OR THEREWITH. The second is Ser. No. 60/283,609, filed Apr. 13, 2001, and titled WIRELESS COMMUNICATION SYSTEM. Such Provisional Patent Applications are incorporated herein by reference.

BACKGROUND OF THE INVENTION

1. Field of the Invention

The present invention relates to voltage-controlled oscillators, and more particularly to calibration circuits for VCO's that include replica charge pumps.

2. Description of Related Art

Voltage-controlled oscillators (VCO's) typically depend on a semiconductor device that varies its capacitance in relation to an applied voltage. Reverse-biased diodes can be fabricated to function as such, and are called varactors.

Conventional phase-locked loops (PLL's) are used in prior art circuits to synthesize local oscillator frequencies used in radio receivers. The most common type of PLL uses a VCO that depends on a varactor. But inexpensive varactor diodes cannot be used in PLL's that need to be tuned over very large frequency ranges, e.g., the VCO constant grows too large or the capacitance variation required becomes unachievable and the PLL has trouble locking. Such circuits when they do lock are very sensitive to digital noise, because a relatively small noise voltage is translated into a relatively large frequency perturbation. For example, in a 1.8-volt system needing a one gigaHertz tuning range, a VCO constant of 1 G Hz/volt would be far too large to be practical.

In general, a smaller VCO constant will result in reduced phase noise. It is very difficult to make good quality VCO's in CMOS; the inductor Q's, for example, are very poor. Therefore it is important that all other factors contributing to phase noise are minimized, the VCO constant being one of them.

The prior art has adopted the practice of switching in and out fixed capacitors and using the varactors to tune between. A one gigaHertz tuning range, for example, would be implemented in ten 100 MHz subranges, with the VCO constant of 100 MHz/volt, a twenty dB reduction.

Unfortunately, with mass produced semiconductor devices such switched fixed capacitors vary with manufacturing process spread and with operating temperatures. So a calibration method and circuit are needed that can reduce the frequency uncertainties that would otherwise be introduced into PLL and VCO applications. Better yet, a built-in calibration method could help in obtaining a longer, more reliable product life.

SUMMARY OF THE INVENTION

An object of the present invention is to provide a voltage controlled oscillator with a relatively large frequency swing with an output in the gigaHertz range.

Another object of the present invention is to provide a calibration method for a VCO in a mass-produced semiconductor device.

A further object of the present invention is to provide a wireless radio oscillator circuit.

Briefly, a local oscillator calibrator embodiment of the present invention comprises a main charge pump that drives a voltage-controlled oscillator (VCO) through a loop filter. A second, replica charge pump can also drive the VCO, but is setup to output only its most positive or most negative analog output control voltage. Since the construction and characteristics of the replica charge pump duplicate the main charge pump, the main charge pump's minimum and maximum analog control outputs can be cloned out to the VCO on demand. A VCO calibration procedure therefore includes switching the VCO to each of its ranges set by a bank of fixed capacitors, and using the replica charge pump to drive the VCO to its minimum and maximum frequency for each range setting. The min-max frequency data is stored in a lookup table, and operational requests to switch to a new channel frequency can be supported with a priori information about which fixed-capacitor range selection will be best.

The above and still further objects, features, and advantages of the present invention will become apparent upon consideration of the following detailed description of specific embodiments thereof, especially when taken in conjunction with the accompanying drawings.

DETAILED DESCRIPTION OF THE INVENTION

Figure 1:
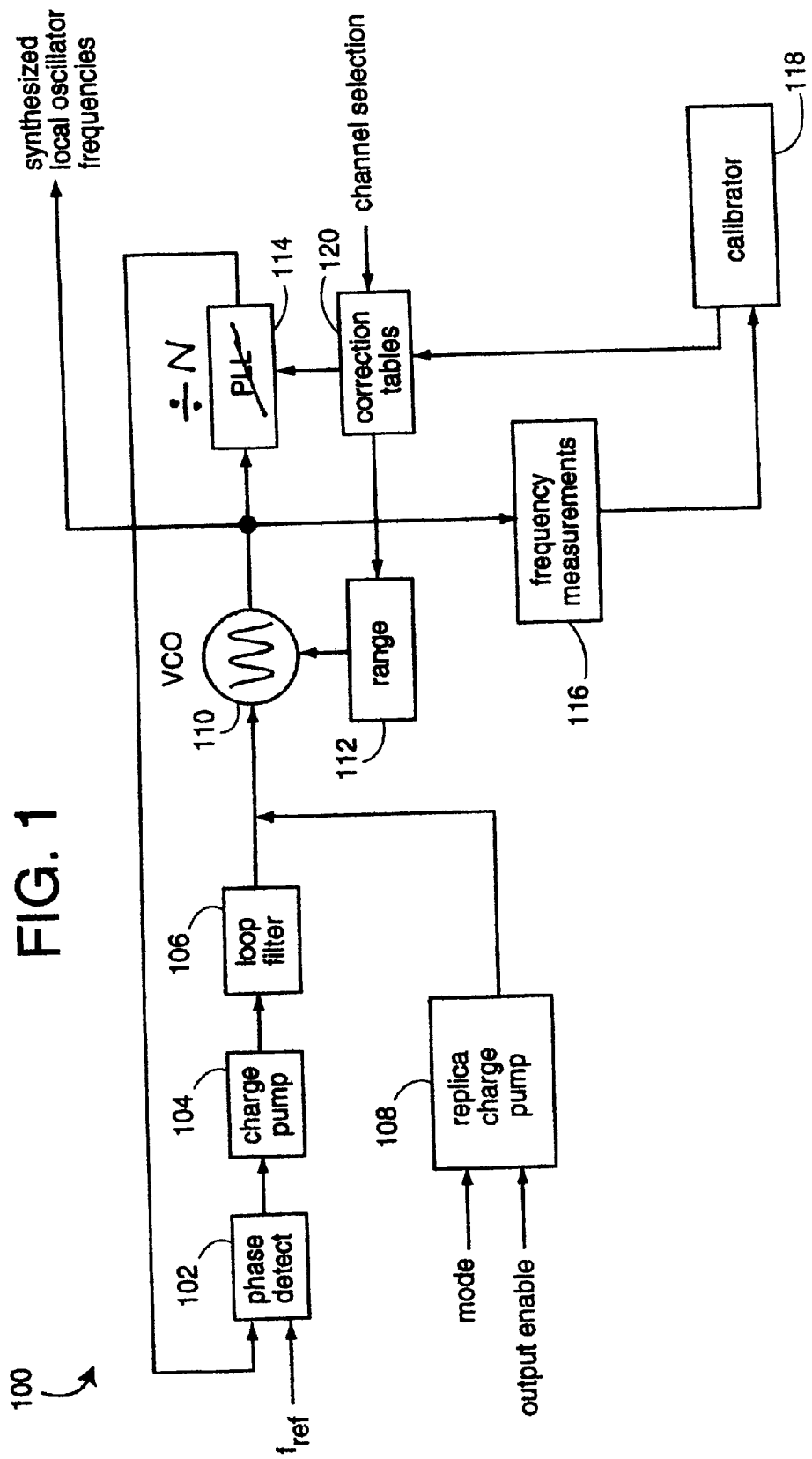
FIG. 1 is a functional block diagram of a local oscillator embodiment of the present invention.

FIG. 1 represents a local oscillator (LO) embodiment of the present invention, and is referred to herein by the general reference numeral 100. The LO 100 is typically used in wireless device applications that operate in the 5.0+GHz spectrum, e.g., the PHY-layer in IEEE-802.11a wireless local area networks. Embodiments of the present invention all use voltage controlled oscillators (VCO's) that switch banks of fixed capacitors to extend and stabilize the VCO tuning range. An uncertainty results in what range of VCO tuning frequencies will result for each selected fixed capacitor in parallel with the relatively small-value continually variable varactor. Embodiments of the present invention all build calibration tables off-line using a clone charge pump and frequency measurement. Such replica charge pump duplicates the performance of the main-service charge pump because it is constructed the same way on the same chip, and is subjected to the same conditions of current, voltage, and temperature, and to the same semiconductor process and variations.

The LO 100 comprises a phase detector 102 that compares a reference frequency ($f_{ref}$) to a feedback sample frequency. Any differences in phase or frequency generate a digital correction signal that is sent to a main-service charge pump 104. The charge pump converts this to an analog control signal, e.g., a current. Such current is converted to a voltage and filtered by a loop filter 106. A replica charge pump 108 is provided for calibration. A variable-voltage control signal is applied by both charge pumps to a voltage-controlled oscillator (VCO) 110. A bank of fixed-value capacitors are included in a range control 112 and will dictate the basic frequency operating range of the VCO 110 in several steps.

Within each such step, the VCO output frequency can be varied by the input control voltage from the charge pumps. In fact, the result is several overlapping steps that give continuous coverage over the entire frequency-output operating range of VCO 110. The basic problem solved by all embodiments of the present invention is the determination of which fixed-value capacitors included in range control 112 should be selected to obtain a particular local oscillator operating frequency. Integrated capacitor, process, temperature, operating voltage, and other device variables can make the points the steps transition from one frequency to the next unknown. Such points may also change over time and not be consistent within manufacturing runs from unit to unit.

The main charge pump 104 is typically connected between power-supply rails Vdd and Vss. Such power supply voltages limit the minimum and maximum output swings that can be generated by main charge pump 104 at the input of VCO 110. The electronic construction and semiconductor process variations of main charge pump 104 also affect the minimum and maximum output swings that can be generated by main charge pump 104. The charge pump output current is programmable, so the minimum and maximum charge pump voltages achieveable are dependent upon the selected charge pump current due to finite FET on-resistance. It is therefore desirable that the calibration be carried out with the same replica charge pump current setting as is used in the main charge pump. The operating temperature will also have some effect. But it is desirable to know the minimum and maximums, at least indirectly, because they affect the operational points the VCO range steps transition from one frequency to the next.

It was decided that including controls on the main charge pump 104 that would artificially drive it to its minimum and maximum output values would be impractical and not particularly effective. A much simpler solution is to try to duplicate the basic charge pump circuitry with a partial clone, e.g., replica charge pump 108. The clone can then be relied on to mimic the operational behavior of the main charge pump, at least at the extreme control points.

Since in one embodiment, only the minimum and maximum output values are of interest, the replica charge pump 108 does not require a phase detector or reference frequencies. A mode control simply causes either the minimum or maximum to be output. An output enable allows the replica charge pump 108 to be tri-stated from the VCO input, e.g., so its capacitance doesn't load the output of the loop filter 106 after calibration.

The VCO 110 has a frequency output that depends on both the analog control voltage and a fixed-capacitor set selection. A voltage-variable-capacitance varactor in the VCO 110 is combined with a number of fixed capacitors to continuously bridge a tuning gap between successive fixed capacitor selections. The actual continuous tuning range effect of the charge pump 104 on the VCO 110 has some uncertainties, and which particular fixed-capacitor set that needs to be selected in range unit 112 for a particular radio channel frequency is consequently uncertain too.

The VCO 10 produces a synthesized local oscillator frequency output that is stabilized to the reference frequency by a phase locked loop (PLL) 114. Such PLL 114 comprises a programmable digital counter. A variety of synthesized frequencies can be output because as the division number "N" is changed, the VCO 110 will slew in frequency so the two inputs at the phase detector 102 will match. In other words, "N" dictates what VCO output frequency divides down to the reference frequency exactly.

During calibration, the replica charge pump 108 is enabled and a frequency measurement unit 116 samples the output of VCO 110. These measurements are taken for each minimum and maximum for each fixed-value capacitor selection possible in range unit 112. A calibrator 118 controls the range selections, the manipulations of replica charge pump 108, and stores the data in a correction table 120.

After calibration, a channel selection request indexes a lookup table in correction tables 120 and drives an appropriate value of "N" to the PLL 114 and the proper capacitor combination selection to range unit 112.

In general, embodiments of the present invention include a selectable bank of fixed capacitors that is operated to change the VCO range. A set of correction tables is generated for converting particular radio channel selections into a correct fixed-capacitor set choice. For example, some radio channel selections could be at points near the frequency break between two successive fixed-capacitor set choices. In one instance, the varactor would be operated near its high-end voltage limit, and in the other instance of fixed-capacitor selection the varactor would be run down to near its minimum voltage limit.

Figure 2:
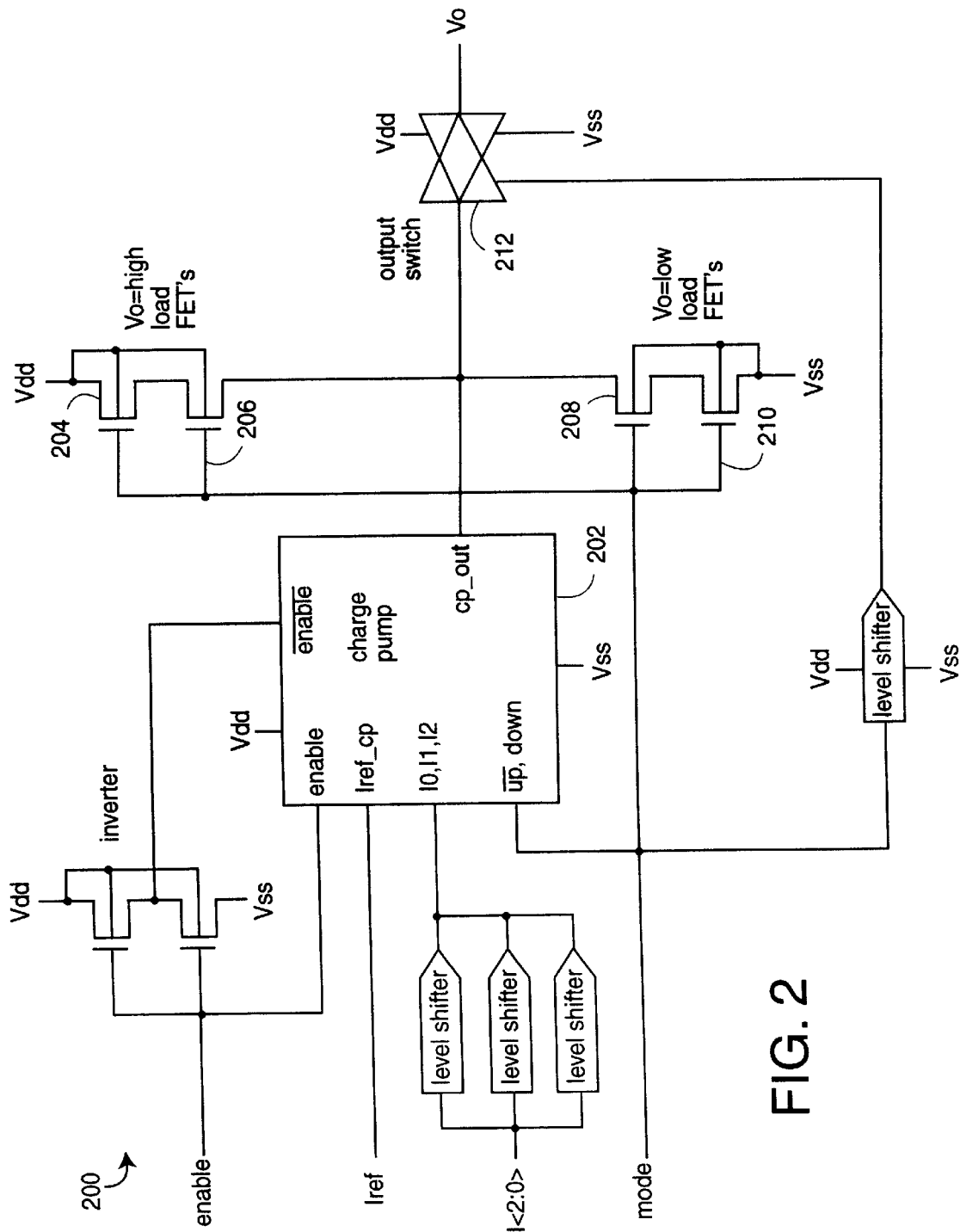
FIG. 2 is a functional block diagram of a replica charge pump embodiment of the present invention, and is similar to those units shown in FIG. 1.

FIG. 2 represents a replica charge pump 200 that could be used as replica charge pump 108 in FIG. 1. The replica charge pump 200 includes a charge pump device 202 that is electronically constructed the same as main charge pump 104 in FIG. 1. It also is subjected to the same operating conditions, e.g., by being integrated on the same chip and powered by the same supply rails. A pair of load FET's 204 and 206 mimic the DC loads placed on the output of main charge pump 104 when the voltage output (Vo) is high. Another pair of load FET's 208 and 210 mimic the DC loads placed on the output of main charge pump 104 when the voltage output (Vo) is low. A tri-state output switch 212 allows the replica charge pump 200 to be off loaded from the external output load.

Figure 3:
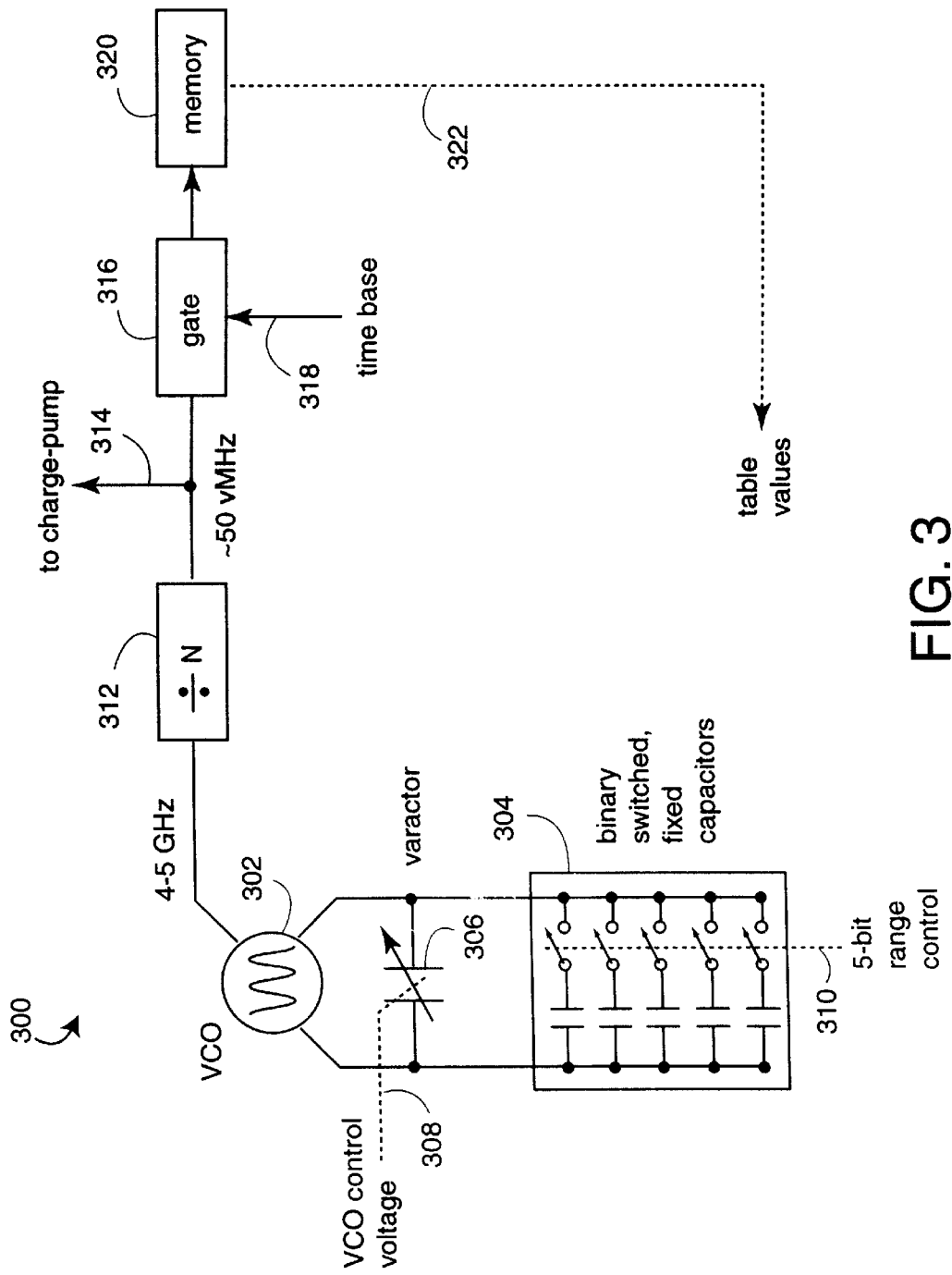
FIG. 3 is a functional block diagram of a voltage-controlled oscillator as used in the local oscillator of FIG. 1 and as driven by the charge pump of FIG. 2.
Figure 1:
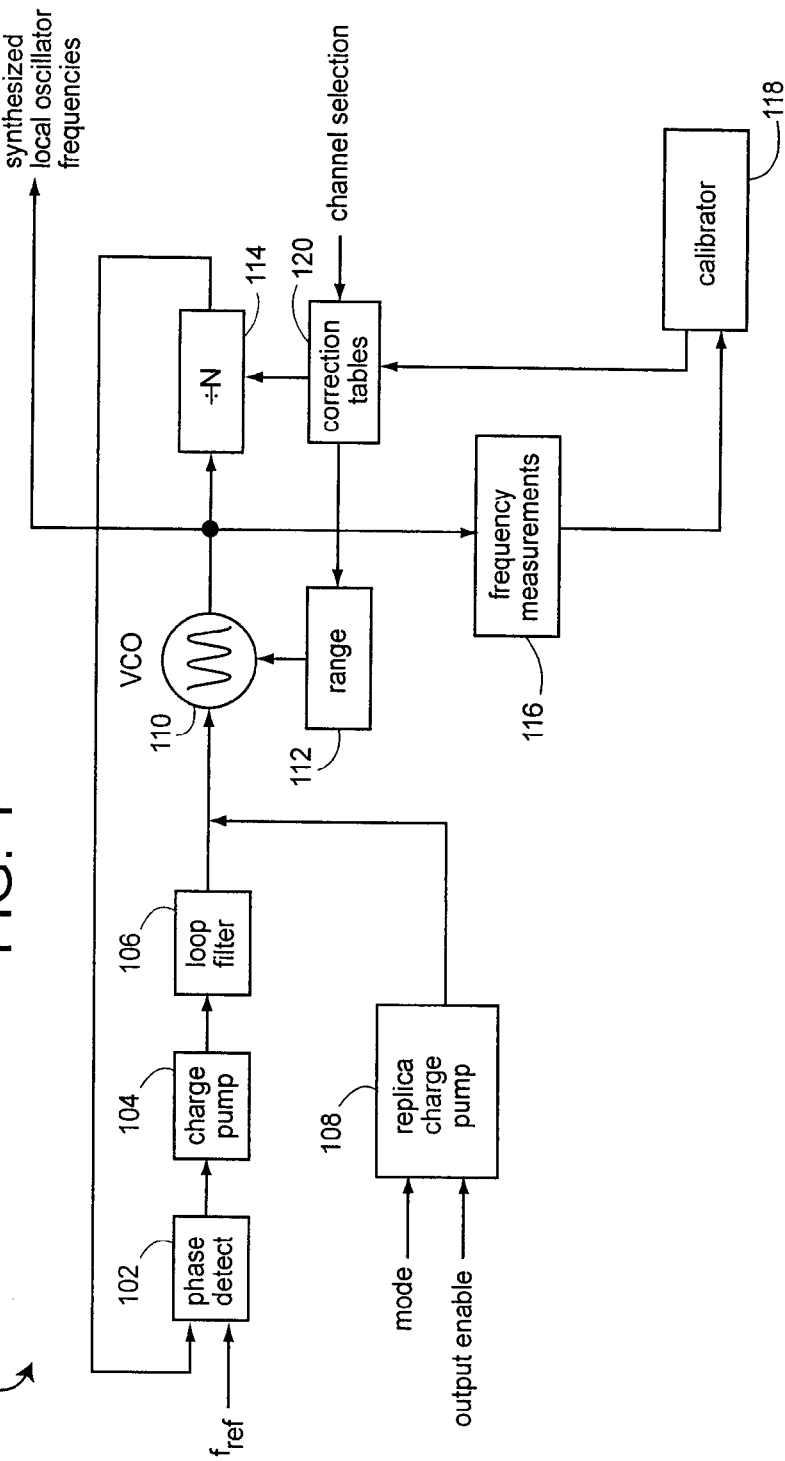
Figure 3:
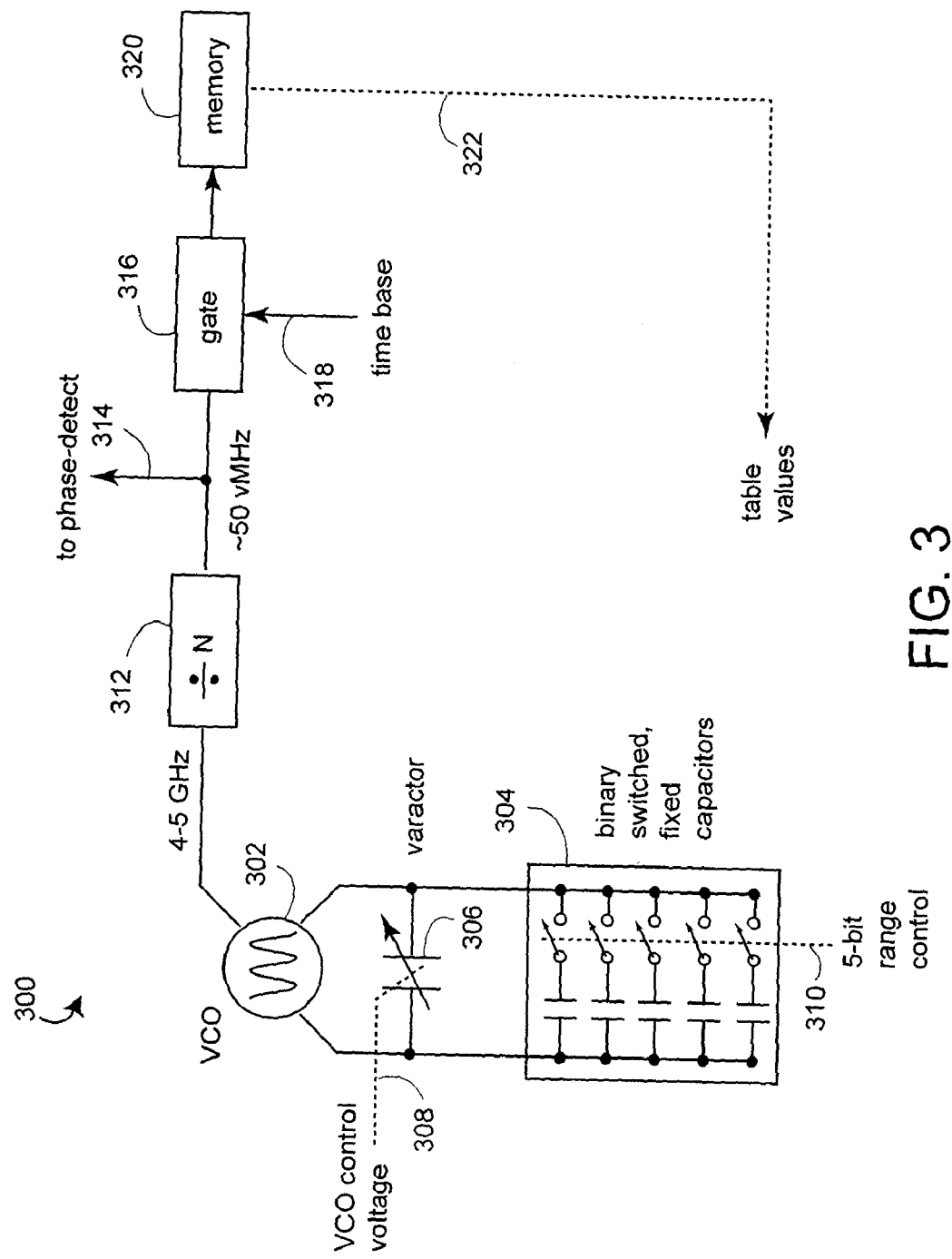

FIG. 3 diagrams a voltage-controlled oscillator (VCO) calibrator embodiment of the present invention, and is referred to herein by the general reference numeral 300. The VCO calibrator 300 comprises a 4–5 GHz oscillator 302 that outputs a frequency dependent on a digitally controlled fixed-capacitor bank 304 and a varactor diode 306. A VCO control voltage 308, e.g., from a charge pump, and a 5-bit range control 310 dictate what frequency "Fo" will be output. A divider 312 provides a sample signal output 314 to the phase detector and to a digital gate 316. A time base 318 allows a gating interval number of clock pulses that can pass through in a base measurement time period. These pulses are counted and stored in a digital memory 320. A number of measurements are taken at a variety of capacitor combinations of range control 310 and the minimum and maximum VCO control voltages 308. Such measurements are stored in a lookup table and made available post-calibration in a signal 322.

The operational assumption is that the output frequency Of will repeat its measured value that was taken during calibration, and that restoring the corresponding 5-bit range control word will provide an initial fixed value of capacitance from capacitor bank 304 that will allow frequency lock within range of the VCO control voltage 308. Sixty-four such measurements and corresponding table lookup entries are preferred.

A translation of radio-channels, for example, to measured frequency table values is preferably executed in software during operation. E.g., in the WIRELESS COMMUNICATION SYSTEM, described in U.S. patent application Ser. No. 60/283,609 filed Apr. 13, 2001 and assigned to the assignee of the present invention. Such patent application is incorporated herein by reference. The translation, is then available for use as 5-bit range control signal 310. In general, the 5-bit range control value associated with the VCO control voltage 308 at minimum is preferred over the corresponding one at maximum.

In alternative embodiments of the present invention, the calibration measurements are taken at a variety of temperatures as monitored by an on-chip temperature sensor. The translation software then preferably finds the set that has the closest calibration temperature for current operating conditions.

In an alternative embodiment of the present invention, a replica charge pump is used to find the center frequency of the range afforded by each fixed capacitor. Such center frequency is measured, and then stored in a look up table together with a calibration value that represents current conditions, e.g., temperature. Otherwise, the value stored could be normalized for the current conditions. During normal operation, the selecting of a channel/frequency includes looking up the capacitor that is appropriate to use. The tuning response and voltage/temperature effects from a normalized table can affect the capacitor choice. If there is sufficient overlap between frequency ranges, and some safety factor is included, an accurate selection can be made based on all process and environmental factors. Such a method would never have to measure the frequencies resulting from the minima and maxima control voltages.

In general, embodiments of the present invention log predetermined points in the tuning range using the replica charge pump. On-the-fly frequency calculations can be made from previously measured data, and result in an accurate fixed-capacitor choice.

Although particular embodiments of the present invention have been described and illustrated, such is not intended to limit the invention. Modifications and changes will no doubt become apparent to those skilled in the art, and it is intended that the invention only be limited by the scope of the appended claims.

What is claimed is:

1. A local oscillator calibrator, comprising:
    a replica charge pump for duplicating a minimum and a maximum output control signal expected to be produced by a main charge pump;
    wherein, the replica charge pump includes controls for enabling its minimum and maximum outputs; and
    wherein, the replica charge pump is connected to a voltage controlled oscillator that includes a bank of fixed-value capacitors for range selection.

2. The calibrator of claim 1, further comprising:
    a main charge pump constructed similar to the replica charge pump and drawing its operating power from the same sources such that its range of output voltage-controlled oscillator (VCO) control signal magnitudes match those of the replica charge pump.

3. The calibrator of claim 2, further comprising:
    a voltage-controlled oscillator (VCO) connected to receive outputs from both the replica charge pump and the main charge pump, and providing a frequency output; and
    a bank of fixed-value capacitors providing a selectable range of operating frequencies for the VCO.

4. The calibrator of claim 3, further comprising:
    a frequency measurement device providing for a frequency reading of a frequency output of the VCO for each of said selectable range of operating frequencies produced by individual ones of the bank of fixed-value capacitors.

5. The calibrator of claim 4, further comprising:
    a calibration table constructed of a plurality of said frequency measurements taken while the replica charge pump is driving the VCO at a predetermined control signal magnitude.

6. The calibrator of claim 1, further comprising:
    a main charge pump constructed similar to the replica charge pump and drawing its operating power from the same sources such that its minimum and maximum output voltage-controlled oscillator (VCO) control signal magnitudes match those of the replica charge pump.

7. The calibrator of claim 6, further comprising:
    a voltage-controlled oscillator (VCO) connected to receive outputs from both the replica charge pump and the main charge pump, and providing a frequency output; and
    a bank of fixed-value capacitors providing a selectable range of operating frequencies for the VCO.

8. The calibrator of claim 7, further comprising:
    a frequency measurement device providing for a frequency reading of a frequency output of the VCO for each of said selectable range of operating frequencies produced by individual ones of the bank of fixed-value capacitors.

9. The calibrator of claim 8, further comprising:
    a calibration table constructed of a plurality of said frequency measurements taken while the replica charge pump is driving the VCO at a maximum or a minimum control signal magnitude.

10. A local oscillator, comprising:
    a voltage-controlled oscillator (VCO) providing a variable frequency output that depends, in part on an analog control input signal, and in part on a capacitance connected to a fixed-capacitor input;
    a bank of fixed-value capacitors connected to said fixed-capacitor input and providing a selectable range of operating frequencies for the VCO;
    a main charge pump connected to control the VCO and having a first analog output control signal that can span between a minimum and a maximum output magnitude which are dependent on operating conditions and electronic construction;
    a replica charge pump having an electronic construction and operating conditions that duplicate the main charge pump such that it provides a second analog output with minimum and maximum output VCO-control signal magnitudes that match those of said first analog output;
    a frequency measurement device providing for a frequency reading of a frequency output of the VCO for each of said selectable range of operating frequencies produced by individual ones of the bank of fixed-value capacitors; and
    a calibration table constructed of a plurality of said frequency measurements taken while said second analog output from the replica charge pump is driving the VCO at said minimum and maximum output VCO-control signal magnitudes.

11. A local oscillator, comprising:
- a voltage-controlled oscillator (VCO) providing a variable frequency output that depends, in part on an analog control input signal, and in part on a capacitance connected to a fixed-capacitor input;
- a bank of fixed-value capacitors connected to said fixed-capacitor input and providing a selectable range of operating frequencies for the VCO;
- a main charge pump connected to control the VCO and having a first analog output control signal that can span between a minimum and a maximum output magnitude which are dependent on operating conditions and electronic construction;
- a replica charge pump having an electronic construction and operating conditions that duplicate the main charge pump such that it provides a second analog output with a predetermined output VCO-control signal magnitude that matches those of said first analog output;
- a frequency measurement device providing for a frequency reading of a frequency output of the VCO for each of said selectable range of operating frequencies produced by individual ones of the bank of fixed-value capacitors; and
- a calibration table constructed of a plurality of said frequency measurements taken while said second analog output from the replica charge pump is driving the VCO at said predetermined output VCO-control signal magnitude.

12. A method for operating a local oscillator that depends on a voltage controlled oscillator with a selectable bank of fixed-value range capacitors, the method comprising the steps of:
- predetermining what minimum and maximum output frequencies result from driving a control input of a voltage-controlled oscillator (VCO) at the minimum and maximum outputs obtainable from a main charge pump;
- tabulating a list of said minimum and maximum output frequencies obtained in the step of predetermining; and
- responding to a request to move a new operating frequency based on said minimum and maximum output frequencies in said list.

13. The method of claim 12, wherein the step of predetermining includes the steps of:
- paralleling the output of a main charge pump that drives said VCO with the output of a replica charge pump;
- constructing the electronics of said replica charge pump to simulate that of said main charge pump; and
- operating said main charge pump and said replica charge pump under the same operating conditions to obtain at least matching minimum and matching maximum outputs that drive said VCO.

14. The method of claim 13, wherein the step of tabulating includes the steps of:
- manipulating said replica charge pump to drive said matching minimum and matching maxim outputs to said VCO;
- measuring a resulting VCO output frequency; and
- building a lookup table of frequency ranges obtained for each one of a selectable bank of fixed-value range capacitors switched on to said VCO.

15. The method of claim 12, further including the step of:
- compensating according to on-chip temperature measurements and a priori data related to the effects of temperature.

16. A means for operating a local oscillator that depends on a voltage controlled oscillator with a selectable bank of fixed-value range capacitors, comprising:
- means for predetermining what minimum and maximum output frequencies result from driving a control input of a voltage-controlled oscillator (VCO) at the minimum and maximum outputs obtainable from a main charge pump;
- means for tabulating a list of said minimum and maximum output frequencies obtained in the step of predetermining; and
- means for responding to a request to move a new operating frequency based on said minimum and maximum output frequencies in said list.

17. The means of claim 16, wherein the means for predetermining includes:
- means for paralleling the output of a main charge pump that drives said VCO with the output of a replica charge pump;
- means for constructing the electronics of said replica charge pump to simulate that of said main charge pump; and
- means for operating said main charge pump and said replica charge pump under the same operating conditions to obtain at least matching minimum and matching maximum outputs that drive said VCO.

18. The means of claim 16, wherein tabulating means includes:
- means for manipulating said replica charge pump to drive said matching minimum and matching maxim outputs to said VCO;
- means for measuring a resulting VCO output frequency; and
- means for building a lookup table of frequency ranges obtained for each one of a selectable bank of fixed-value range capacitors switched on to said VCO.

19. The means of claim 16, further comprising:
- means for compensating according to on-chip temperature measurements and a priori data related to the effects of temperature.

* * * * *

UNITED STATES PATENT AND TRADEMARK OFFICE
CERTIFICATE OF CORRECTION

PATENT NO.    : 6,512,419 B1                                      Page 1 of 1
DATED         : January 28, 2003
INVENTOR(S)   : Adams et al.

It is certified that error appears in the above-identified patent and that said Letters Patent is hereby corrected as shown below:

Column 3,
Line 66, replace "10" with -- 110 --.

Signed and Sealed this

Tenth Day of June, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,512,419 B1
DATED : January 28, 2003
INVENTOR(S) : Adams et al.

It is certified that error appears in the above-identified patent and that said Letters Patent is hereby corrected as shown below:

The title page, showing an illustrative figure, should be deleted and substitute therefore the attached title page.

<u>Drawings,</u>
Kindly replace FIG. 1 with corrected FIG. 1 attached hereto.
Kindly replace FIG. 3 with corrected FIG. 3 attached hereto.

<u>Column 4,</u>
Line 1, after "(PLL)" insert -- that includes a divide-by-N divider --.
Line 1, replace "Such PLL" with -- Such divider --.
Line 17, replace "PLL" with -- divider --.
Line 64, replace "Of" with -- Fo --.

Signed and Sealed this

Twenty-sixth Day of August, 2003

JAMES E. ROGAN
*Director of the United States Patent and Trademark Office*

United States Patent
Adams et al.

(10) Patent No.: US 6,512,419 B1
(45) Date of Patent: Jan. 28, 2003

(54) METHOD AND APPARATUS TO TUNE AND CALIBRATE AN ON-CHIP OSCILLATOR IN A WIRELESS TRANSCEIVER CHIP

(75) Inventors: Andrew Adams, Stanmore (AU); Neil Weste, Castle Hill (AU); Stephen Avery, Kellyville (AU)

(73) Assignee: Cisco Sytems Wireless Networking (Australia) Pty Limited, North Sydney (AU)

(*) Notice: Subject to any disclaimer, the term of this patent is extended or adjusted under 35 U.S.C. 154(b) by 0 days.

(21) Appl. No.: 09/952,925

(22) Filed: Sep. 14, 2001

Related U.S. Application Data

(60) Provisional application No. 60/277,370, filed on Mar. 19, 2001, and provisional application No. 60/283,609, filed on Apr. 13, 2001.

(51) Int. Cl.[7] .............. H03L 7/08; H03L 7/085; H03L 7/099; H03L 7/18
(52) U.S. Cl. .............. 331/17; 331/8; 331/44; 331/179; 327/156; 327/157
(58) Field of Search .............. 331/1 A, 8, 10, 331/12, 17, 18, 25, 44, 179; 327/11, 156–159; 360/51; 375/376; 455/260

(56) References Cited

U.S. PATENT DOCUMENTS

| | | | |
|---|---|---|---|
| 4,409,563 A | 10/1983 | Vandegraaf | 331/11 |
| 5,259,007 A | 11/1993 | Yamamoto | 375/120 |
| 5,686,867 A | * 11/1997 | Sutardja et al. | 331/177 R |

* cited by examiner

Primary Examiner—David C. Mis
(74) Attorney, Agent, or Firm—Dov Rosenfeld; Inventek

(57) ABSTRACT

A local oscillator calibrator comprises a main charge pump that drives a voltage controlled oscillator (VCO) through a loop filter. A second, replica charge pump can also drive the VCO, but is setup to output only its most positive or most negative analog output control voltage. Since the construction and characteristics of the replica charge pump duplicate the main charge pump, the main charge pump's minimum and maximum analog control outputs can be cloned out to the VCO on demand. A VCO calibration procedure therefore includes switching the VCO to each of its ranges set by a bank of fixed capacitors, and using the replica charge pump to drive the VCO to its minimum and maximum frequency for each range setting. The min-max frequency data is stored in a lookup table, and operational requests to switch to a new channel frequency can be supported with a priori information about which fixed-capacitor range selection will be best.

19 Claims, 3 Drawing Sheets

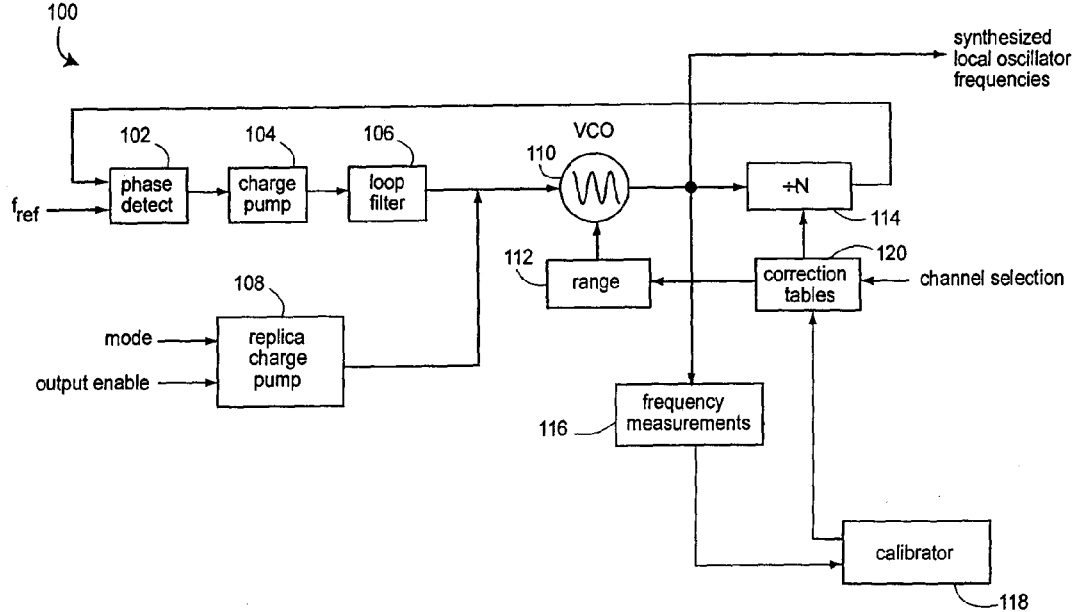

UNITED STATES PATENT AND TRADEMARK OFFICE
CERTIFICATE OF CORRECTION

PATENT NO. : 6,512,419 B1
DATED : January 28, 2003
INVENTOR(S) : Adams et al.

It is certified that error appears in the above-identified patent and that said Letters Patent is hereby corrected as shown below:

Column 8,
Line 41, kindly change "claim 16," to -- claim 17, --.

Signed and Sealed this

Twenty-sixth Day of July, 2005

JON W. DUDAS
*Director of the United States Patent and Trademark Office*